United States Patent [19]

Izawa et al.

[11] Patent Number: 4,745,339
[45] Date of Patent: May 17, 1988

[54] LAMP FAILURE DETECTING DEVICE FOR AUTOMOBILE

[75] Inventors: Minoru Izawa, Toyota; Ryohei Doi; Ritsuo Suzuki; Kenichi Kinoshita, all of Aichi, Japan

[73] Assignee: Kabushiki Kaisha Tokai Rika Denki Seisakusho, Japan

[21] Appl. No.: 849,415

[22] Filed: Apr. 8, 1986

[30] Foreign Application Priority Data

Apr. 12, 1985 [JP] Japan ............................ 60-055207[U]

[51] Int. Cl.$^4$ ............................................... H01J 1/60
[52] U.S. Cl. ..................................... 315/130; 315/82; 315/129; 340/641; 340/642
[58] Field of Search .................... 315/129, 130, 82; 340/641, 642

[56] References Cited

U.S. PATENT DOCUMENTS

| | | | |
|---|---|---|---|
| 3,719,937 | 3/1973 | Doyle | 315/130 |
| 3,735,378 | 5/1973 | McNamee | 315/129 |
| 3,952,229 | 4/1976 | Rekow | 340/642 |

FOREIGN PATENT DOCUMENTS 51-156981  12/1976  Japan .

Primary Examiner—Harold Dixon
Attorney, Agent, or Firm—Harvey D. Fried

[57] ABSTRACT

A lamp failure detecting device for automobile consists of a lamp circuit including a plurality of lamps connected in parallel, a current-detecting resistance connected to a power-supply source through the lamp circuit in series, a first voltage divider circuit including resistances to which a voltage divided by the current detecting resistance and the lamp circuit is applied a second voltage divider circuit including resistances to which a voltage supplied from the power-supply source is applied and a comparator circuit comparing the difference between the divided voltages in the voltage divider circuits to produce a a failure detection signal. Diodes are provided in the first and second voltage divider circuits respectively in the forward direction. Non-linearity of the current flowing through the lamps for the change of the power-supply voltage is corrected by the diodes.

3 Claims, 2 Drawing Sheets

LAMP FAILURE DETECTING DEVICE FOR AUTOMOBILE

BACKGROUND OF THE INVENTION

1. Field of the Invention

This invention relates to a device for detecting lamp failure in automobiles such as burn-out of lamps or short-circuit, and more particularly to such a device which utilizes the change of voltage depending on the electric current change caused by lamp failure as an object to be detected.

2. Description of the Prior Art

Japanese patent application No. 54-51041 discloses a lamp failure detecting device of the type, which employs a means for detecting the change of potential difference across ends of a current-detecting resistance connected in series to a plurality of lamps connected in parallel in the occurrence of electric current change caused by failure of one or a plurality of lamps. FIG. 6 illustrates a construction of such a prior art device which is used for detecting failure of turn indicator lamps of automobiles. In FIG. 6, numeral 1 designates a storage battery and numeral 2 a plurality of right side turn indicator lamps connected in parallel. The parallel circuit comprising the lamps 2 is connected to the battery 1 through a turn indicator switch 3, a current-detecting resistance 4, an ignition switch $S_1$ and a fuse F. Voltage divider circuits 9 and 10 comprising resistances 5, 6 and 7, 8 respectively are connected to respective ends A and B of the current-detecting resistance 4. Voltage-dividing points $A_1$ and $B_1$ of the voltage divider circuits 9 and 10 are connected to a non-inversible input terminal (+) and an inversible input terminal (−) of a comparator 11 respectively. When failure occurs to one of the lamps, the value of current flowing through the current-dividing resistance 4 is decreased and voltage is raised at a connection B of the resistance 4, that is, at the voltage-dividing point $B_1$ of the voltage divider circuit 10. Output of the comparator 11 is inverted, thereby detecting failure of the lamp.

As shown in FIG. 7, however, each lamp 2 shows a non-linearity that an increase ratio of the current I flowing through each lamp 2 is decreased as power-supply voltage $V_P$ increases because the resistance at each lamp 2 rises as the power-supply voltage increases with the temperature of a filament rising. When the power-supply voltage $V_P$ increases, voltage $V_0$ at the voltage-dividing point $A_1$ of the voltage divider circuit 9 increases linearly in accordance with the increase of the power-supply voltage $V_P$ as shown in FIG. 8. Voltage at the voltage-dividing point $B_1$, however, increases non-linearly in the normal state where no lamp failure occurs and in the case where failure occurs to one of the lamps, as shown by $V_1$ and $V_2$ in FIG. 8 respectively. In order that failure of the lamps 2 is detected by the comparator 11, voltages $V_1$ and $V_2$ at the voltage-dividing point $B_1$ in the normal state and in the case where failure occurs to one of the lamps respectively, necessitate taking the values below and above the voltage $V_0$ at the voltage-dividing point $A_1$ respectively as shown in FIG. 8. A range L of the power-supply voltage capable of correctly detecting lamp failure (a lamp failure detectable range) is restricted to a narrow region $L_1$ between intersections $P_1$ and $P_2$ of a line denoting the voltage $V_0$ at the voltage-dividing point $A_1$ and two curved lines denoting respective voltages $V_1$ and $V_2$ at the voltage-dividing point $B_1$ in the normal state and in the case where failure occurs to one of the lamps. As a result, when the power-supply voltage is increased beyond the lamp failure detectble range, correct detection of lamp failure cannot be expected. This means that an error detection occurs in the case of automobile in which the power-supply voltage is not constant.

In a device disclosed by Japanese patent application No. 51-156981, an operational circuit is provided for compensating for non-linearity of the current flowing through the lamps, thereby preventing the error detection and enlarging the lamp failure detectable range. However, this construction necessitates an expensive circuit for compensating for non-linearity of the current flowing through the lamps, which raises the production cost of the device.

SUMMARY OF THE INVENTION

It is, therefore, a primary object of this invention to provide an improved device for detecting lamp failure in automobiles wherein enlargement of the lamp failure detectable range is attained by an inexpensive means.

It is a second object of this invention to provide an improved device for detecting lamp failure in automobiles wherein the lamp failure detectable range is free from influence of the change of ambient temperature.

According to this invention, the device for detecting lamp failure in automobiles comprises a lamp circuit comprising a plurality of lamps connected in parallel, a current-detecting resistance connected to a power source through the lamp circuit in series, a first voltage divider circuit comprising resistances each energized by voltage divided by the current-detecting resistance and the lamp circuit, a second voltage divider circuit comprising resistances to which a voltage supplied from the power-supply source is applied, and a comparator circuit for comparing the difference between voltages in the two voltage divider circuits to thereby produce a lamp failure detection signal. Elements having diode characteristics and non-linear voltage-current characteristics are connected in series to to the respective voltage divider circuits in the forward direction.

According to the above-described construction, non-linearity of the divided voltage in the first voltage divider circuit due to non-linearity of the current flowing through the lamps is compensated for by non-linearity of voltage drop in the elements having diode characteristics in the forward direction. Consequently, the lamp failure detectable range of the power-supply voltage change is enlarged. This is profitable for automobile in which power-supply voltage extremely changes.

A current characteristic of the element having diode characteristics in the second voltage divider circuit for the voltage is changed by the ambient temperature, which operates to compensate, in the comparator circuit, for the change of the current characteristic of the element having diode characteristics in the first voltage divider circuit. As a result, lamp failure detecting efficiency of the device is not influenced by the ambient temperature.

The above and further objects and novel features of the invention will more fully appear from the following detailed description when the same is read in connection with the accompanying drawings. Other objects and advantages of the invention will become apparent from the following description of embodiments with reference to the accompanying drawings.

DESCRIPTION OF PREFERRED EMBODIMENTS

Figure 1:
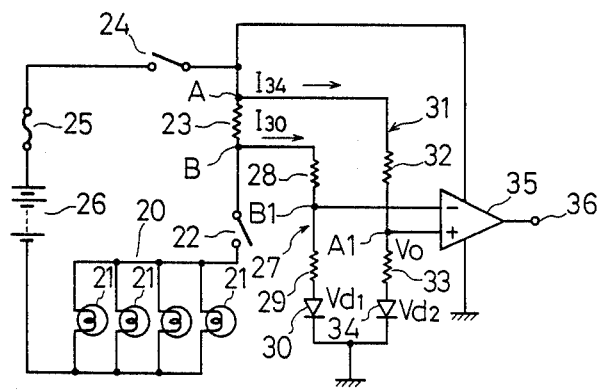
FIG. 1 is a schematic diagram of one form of electric circuit embodying the invention.

FIG. 1 shows, for example, a circuit for detecting failure of right side turn indicator lamps in an automobile. A lamp circuit 20 is comprised of a plurality of, for example, four, lamps 21 connected in parallel. Two of the the lamps 21 are provided at the front side and the right-hand side of the automobile respectively and the others are provided at the rear side. The lamp circuit 20 is connected in series to a turn indicator switch 22 adapted to be turned on and off in a predetermined cycle, a lamp failure detecting resistance 23, an ignition switch 24 and a fuse 25. This series circuit is connected to the ends of a storage battery as the power-supply source.

A first voltage divider circuit 27 comprises two resistances 28 and 29 and a diode 30 as an element having diode characteristics, all of which are connected in series. The first voltage divider circuit 27 is connected between a terminal B as a voltage-dividing point and a ground potential point so as to be energized by voltage divided by the lamp circuit 20 and the lamp failure detecting resistance 23.

A second voltage divider circuit 31 also comprises two resistances 32 and 33 and a diode 34 as an element having diode characteristics, all of which are connected in series. The second voltage divider circuit 31 is connected between a terminal A and a ground potential point. An inversible input terminal (−) of a comparator circuit 35 is connected to a voltage-dividing point $B_1$ of the first voltage divider circuit 27. A non-inversible input terminal (+) is connected to a voltage-dividing point $A_1$ of the second voltage divider circuit 31. In this case, each of the diodes 30 and 34 is connected in the forward direction for the applied voltage.

Operation of the above-described device will hereinafter be described. The value of voltage $V_0$ applied to the non-inversible input terminal (+) of the comparator circuit 35, that is, the value of voltage at the voltagedividing point $A_1$, is gained by adding the value of voltage drop of the resistance 33 in the voltage divider circuit 31 to the value of forward voltage $Vd_2$ in accordance with the current flowing through the diode 34. The value of voltage applied to the inversible input terminal (−) of the comparator circuit 35, that is, the value of voltage at the voltage-dividing point $B_1$, is gained by adding the value of voltage drop of the resistance 29 in the voltage divider circuit 27 to the value of forward voltage $Vd_1$ in accordance with the current flowing through the diode 30. Since the resistance values of the resistances 28-32 are set so that the voltage $V_0$ at the voltage-dividing point $A_1$ of the voltage divider circuit 31 becomes higher than the voltage $V_1$ at the voltage-dividing point $B_1$ of the voltage divider circuit 27 in the normal state where no failure occurs to the lamps 21, the output terminal 36 of the comparator circuit 35 is in the high-level. In the case where failure occurs to one of the lamps 21, the current flowing through the current-detecting resistance 23 is reduced through the voltage $V_0$ at the voltage-dividing point $A_1$ remains at a constant value. Consequently, voltage at the connection B of the current-detecting resistance 23, in other words, voltage at the voltage-dividing point $B_1$ of the voltage divider circuit 27 is increased to the value $V_2$ ($V_1 < V_0 < V_2$), so that the output of the comparator circuit 35 is inverted from the high-level to the low-level. Thus, failure of the lamp 21 is detected.

Figure 2:
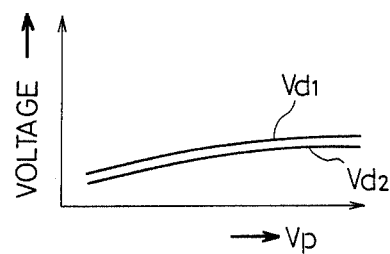
FIG. 2 is a graph illustrating voltage drop characteristics of the diode in FIG. 1 in the forward direction.
Figure 8:
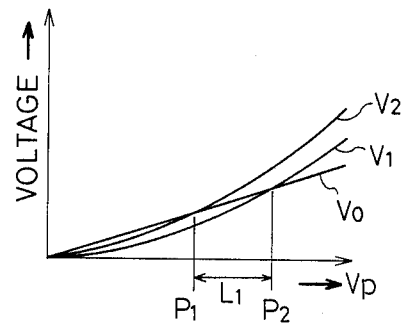
FIG. 8 is a graph similar to FIG. 3 illustrating characteristics of divided voltages in two voltage divider circuits in FIG. 6.

Since the current flowing through the lamps 21 has a non-linear characteristic for power-supply voltage $V_P$ as afore-mentioned, the rise rate of the voltages $V_1$ and $V_2$ at the connection B of the current-detecting resistance 23 is increased. As a result, the current flowing through the lamps 21 shows a characteristic similar to that of the voltages $V_1$ and $V_2$ at the voltage-dividing point $B_1$ shown in FIG. 8. On the other hand, each of the forward voltages $Vd_1$ and $Vd_2$ of the respective diodes 30 and 34 has a nonlinear current characteristic for the power-supply voltage $V_P$, which characteristics are shown by curved lines in the opposite direction to those of voltages $V_1$ and $V_2$ as shown in FIG. 2.

Figure 3:
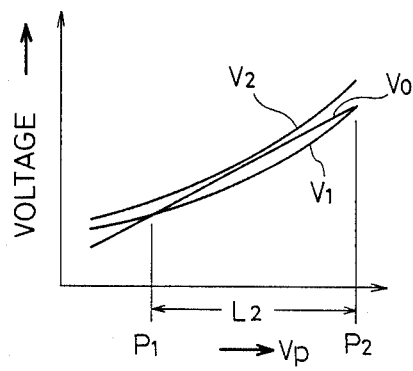
FIG. 3 is also a graph illustrating characteristics of divided voltages in two voltage divider circuits in FIG. 1.

The voltage-current characteristics of a diode is usually shown by the following equation (1). The above-mentioned non-linearity will become apparent by taking into consideration a case where a forward current I is increased with rise of the power-supply voltage in an equation (2) obtained by transformation of the equation (1) with forward current as a parameter:

$$I = Is(e^{\frac{q \cdot V}{k \cdot T}} - 1) \quad (1)$$

$$V = k \cdot T/q \cdot \ln\{(I/Is)\} + 1 \quad (2)$$

$$\Delta V = k \cdot T/q \cdot \ln\{I_{30}/I_{34}\} \quad (3)$$

where
Is=saturated current
q=charge of electron
k=Boltzmann's constant
T=absolute temperature FIG. 3 shows characteristics of the voltages at the voltage-dividing points $A_1$ and $B_1$ gained by adding the values of voltage drop of the resistances 29 and 33 in the respective voltage divider circuits 27 and 31 to the values of forward voltages of the respective diodes 30 and 34, in other words, voltages at the non-inversible and inversible terminals (+) and (−) of the comparator 35. Non-linearity of the forward voltage $Vd_1$ in the diode 30 restrains the rise rate of voltages $V_1$ and $V_2$ with rise of the power-supply voltage $V_P$. On the other hand, nonlinearity of the forward voltage $Vd_2$ in the diode 34 changes the linearity of voltage $V_0$ into a characteristic shown by a curved line approximating the line in FIG. 2. Consequently, the distance between two intersections $P_1$ and $P_2$ of the curved lines showing the characteristics of voltages $V_1$ and $V_2$ respectively is increased, that is, the lamp failure detectable range $L_2$ is increased as compared with the one shown in FIG. 8.

As is evident from the equation (2), the forward voltage V of the diode is changed by the temperature T, but the diode 34 is connected in series in the forward direction within the voltage divider circuit 31 in which a reference voltage is obtained. When voltage at the voltage-dividing point $B_1$ changes in accordance with the change of the forward voltage of the diode 30 under the influence of the ambient temperature, the forward voltage of the diode 34, that is, voltage at the voltage-dividing point $A_1$ is also changed to thereby offset the influence of the ambient temperature. In this connection, the value of $\Delta V = Vd_1 - Vd_2$ is constant where ratio $I_{30}/I_{34}$ in equation (3) is constant. Consequently, the arrangement that the diodes 30 and 34 are connected in series to the voltage divider circuits 27 and 31 respectively as shown in FIG. 1 changes $V_1$ and $V_2$ from the characteristics in FIG. 8 to those in FIG. 3. With respect to this case, especially in this embodiment, the diodes 30 and 34 are integrally formed in a single semiconductor pellet, so that the voltage-current characteristic of the diode 30 is approximately identical to that of the diode 34, thereby effectively offsetting the influence of the ambient temperature.

Although the current flowing through the lamps 21 has a non-linearity for the power-supply voltage, it is compensated for regardless of the change of ambient temperature, thereby increasing the lamp failure detectable range of the power-supply voltage. Consequently, failure of the lamps 21 is always detected correctly though the power-supply voltage in the automobile changes over a wide range. In this connection, an experiment shows that failure of the lamps in automobile is detected correctly within 7 to 20 V range of the power-supply voltage by the device according to the first embodiment of this invention.

Increase of lamps in number narrows the lamp failure detectable range of the power-supply voltage, so that small number of lamp failures can be detected in the prior art construction. In this embodiment, however, lamp failure is detected even if the number of lamps is increased. Further, addition of low-cost diodes provides a lamp failure detecting device the production cost of which is lower than the prior art device to which a complicated operational circuit is added. Further, the operational circuit of the prior art lamp failure detecting device must be redesigned in the case of change in specifications of the lamp. In this invention, however, the change in specifications of the lamp just causes adjustment of the voltage-dividing resistances, each having a simple construction and produced at a low cost.

The changing of resistance value of the resistances 32 and 33 making up the voltage divider circuit 31 changes the slope of $V_0$ for power-supply voltage $V_P$. Consequently, the values of resistances 32 and 33 can be selected so that a distance between between intersections $P_1$ and $P_2$ in FIG. 3 is increased.

Figure 4:
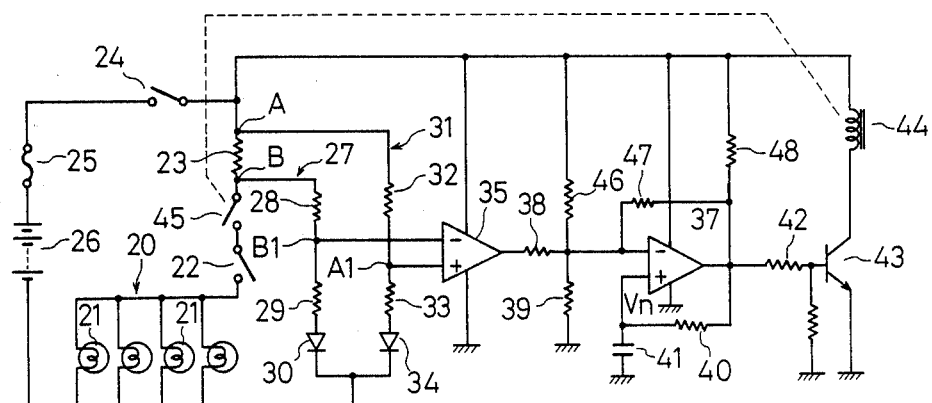
FIG. 4 is a schematic diagram of an electric circuit employed in a second embodiment of the invention.

FIG. 4 illustrates a second embodiment of this invention. The second embodiment differs from the first embodiment in that flashing cycle of the lamps 21 can be changed by making use of output of the comparator circuit 35. In FIG. 4, the same parts are labelled by the same numerals as those in FIG. 1. A non-inversible input terminal (+) of a comparator circuit 37 is connected to an output terminal of a comparator circuit 35 through a resistance 38 and grounded through a resistance 39. An inversible input terminal (−) of the comparator circuit 37 is connected to a time-constant circuit comprising a resistance 40 and a capacitor 41. An output terminal of the comparator circuit 37 is connected to a base of a transistor 43 through a resistance 42. A relay 44 is connected between a collector of the transistor 43 and the positive power line. The relay 44 closes and opens a relay switch 45 provided between a turn indicator switch 22 and a current-detecting resistance 23. A resistance 46 is connected between the positive power line and the non-inversible input terminal (+) of the comparator circuit 37. A resistance 47 is connected between the non-inversible input terminal (+) and the output terminal of the comparator circuit 37. A resistance 48 is connected between the positive power line and the output terminal of the comparator circuit 37.

Operation of the device of the second embodiment will hereinafter be described. When the output terminal of the comparator 37 is in the high-level, the capacitor 41 is charged through the resistance 40, so that voltage Vn at the inversible input terminal (−) of the comparator circuit 37 rises. When the value of voltage Vn reaches a threshold voltage $V_H$ suppied to the non-inversible input terminal (+), the output terminal of the comparator circuit 37 turns to the low-level. The capacitor 41 is discharged through the resistance 40, whereby voltage Vn drops. When voltage Vn reaches a threshold voltage $V_L$ supplied anew to the non-inversible input terminal (+), the output terminal of the comparator circuit 37 turns to the high-level. Thus, the transistor 43 cycles on and off to thereby close and open the relay switch 45 while the output terminal of the comparator circuit 37 continues to be inverted and reinverted in a cycle depending on the threshold voltages $V_L$ and $V_H$, thereby flashing the lamps 21. Application of the threshold voltages $V_L$ and $V_H$ to the non-inversible input terminal (+) of the comparator circuit 37 depends on whether the output terminal of the comparator circuit 35 is in the high-level or in the low-level. The output terminal of the comparator circuit 35 is turned to the low-level when failure occurs to at least one of the lamps 21, so that the inversion cycle of the output terminal of the comparator circuit 37, that is, the cycle in which the lamps 21 flash becomes shorter than in the normal state when failure occurs to at least one of of the lamps 21, whereby the driver of the automobile becomes aware of failure of the lamp 21.

Figure 5:
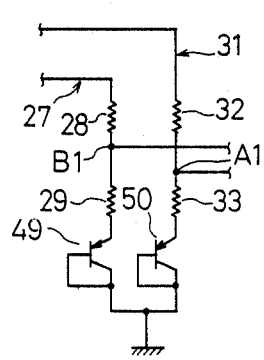
FIG. 5 is a partial schematic diagram of an electric circuit employed in a modification of the first embodiment in FIG. 1.
Figure 6:
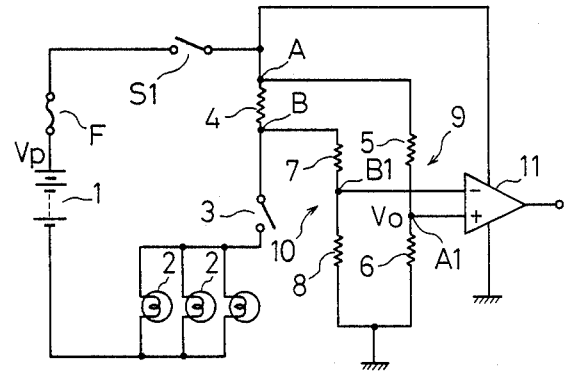
FIG. 6 is a circuit diagram of a prior art device for detecting lamp failure in automobile.
Figure 7:
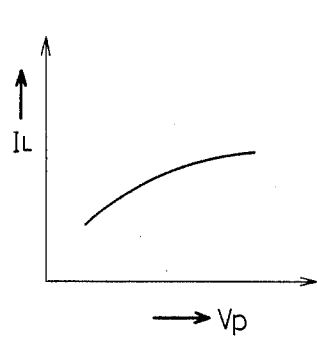
FIG. 7 is a graph illustrating a characteristic of the electric current for the voltage applied to the lamps.

FIG. 5 illustrates a modification of the first embodiment. The diodes are used as an element having diode characteristics in the above-described embodiments. As shown in FIG. 5, where the same parts are labelled by the same numerals as those in FIG. 1, PNP or NPN transistors 49 and 50 in which the base is connected to the collector may be used for the diodes.

This invention thus provides a low-cost device which is capable of correctly detecting failure of a plurality of lamps in automobiles over a wide range of the power-supply voltage.

Although the present invention has been described with reference to the particular embodiments herein set forth, it is understood that the present disclosure has been made only by way of example and that numerous changes in the details of the construction may be resorted to without departing from the spirit and scope of the invention. Thus, the scope of the invention should not be limited by the foregoing specification, but rather, only by the scope of the claims appended hereto.

What is claimed is:

1. A lamp failure detecting device for automobiles comprising:
   (a) a lamp circuit comprising a plurality of lamps connected in parallel and a power-supply source;
   (b) an electric current detecting resistance connected in series to the power-supply source and said lamp circuit, said electric current detecting resistance having two terminals;
   (c) a first voltage divider circuit comprising a plurality of first resistances connected in series between one of the terminals of said electric current detecting resistance and a ground potential point;
   (d) a second voltage divider circuit comprising a plurality of second resistances connected in series between the other terminal of said electric current detecting resistance and the ground potential point;
   (e) a first diode connected in series to the first resistances of said first voltage divider circuit in the forward direction;
   (f) a second diode connected in series to the second resistances of said second voltage divider circuit in the forward direction; and
   (g) a comparator circuit having its inputs connected respectively to the junction of resistors in the first voltage divider circuit and in the second voltage divider circuit for comparing the divided voltages gained in said first and second voltage divider circuits, thereby producing a lamp failure detection signal in the case where a failure occurs in at least one of the lamps.

2. A lamp failure detecting device for automobiles as set forth in claim 1 wherein the number of first resistances is two and the number of second resistances is two.

3. A lamp failure detecting device for automobiles comprising:
   (a) a lamp circuit comprising a plurality of lamps connected in parallel and a power-supply source;
   (b) an electric current detecting resistance connected in series to the power-supply source and said lamp circuit, said electric current detecting resistance having two terminals;
   (c) a first voltage divider circuit comprising a plurality of first resistances connected in series between one of the terminals of said electric current detecting resistance and a ground potential point;
   (d) a second voltage divider circuit comprising a plurality of second resistances connected in series between the other terminal of said electric current detecting resistance and the ground potential point;
   (e) a first transistor connected in series to the first resistances of said first voltage divider circuit, the first transistor comprising a first collector-emitter circuit, the first collector-emitter circuit being forwardly biased;
   (f) a second transistor connected in series to the second resistances of said second voltage divider circuit, the second transistor comprising a second collector-emitter circuit, the second collector-emitter circuit being forwardly biased; and
   (g) a comparator circuit having its inputs connected respectively to the junction of resistors in the first voltage divider circuit and in the second voltage divider circuit for comparing the divided voltages gained in said first and second voltage divider circuits, thereby producing a lamp failure detection signal in the case where a failure occurs in at least one of the lamps.

* * * * *